US006129203A

United States Patent [19]

Kiyomura et al.

[11] Patent Number: 6,129,203

[45] Date of Patent: Oct. 10, 2000

[54] IC DISCARDING APPARATUS FOR FLIP CHIP MOUNTING FACILITY

[75] Inventors: Hiroyuki Kiyomura, Takatsuki; Shinji Kanayama, Kashihara; Nobuya Matsumura, Kyoto; Kenichi Nishino, Osaka; Kenji Takahashi, Suita; Naomi Kainou, Hirakata, all of Japan

[73] Assignee: Matsushita Electric Industrial Co., Ltd., Japan

[21] Appl. No.: 09/029,391

[22] PCT Filed: Jul. 2, 1997

[86] PCT No.: PCT/JP97/02296

§ 371 Date: Feb. 27, 1998

§ 102(e) Date: Feb. 27, 1998

[87] PCT Pub. No.: WO98/01901

PCT Pub. Date: Jan. 15, 1998

[30] Foreign Application Priority Data

Jul. 4, 1996 [JP] Japan .................................... 8-174041

[51] Int. Cl.[7] ..................................................... B65G 23/00

[52] U.S. Cl. .................................... 198/832.1; 198/468.4

[58] Field of Search .............................. 198/832.1, 468.4

[56] References Cited

U.S. PATENT DOCUMENTS

| | | | |
|---|---|---|---|
| 3,189,193 | 6/1965 | Merchant | 198/468.4 |
| 4,057,149 | 11/1977 | Clarke | 214/1 BV |
| 4,318,465 | 3/1982 | Calvert et al. | 198/832.1 |
| 4,886,412 | 12/1989 | Wooding et al. | 414/416 |
| 5,330,043 | 7/1994 | Stuckey | 198/468.4 |

FOREIGN PATENT DOCUMENTS

| | | | |
|---|---|---|---|
| 0 017 489 A1 | 10/1980 | European Pat. Off. . | |
| 216701 | 4/1987 | European Pat. Off. | 198/468.4 |
| 0 431 637 A1 | 6/1991 | European Pat. Off. . | |
| 1456733 | 5/1969 | Germany | 198/832.1 |
| 3-184352 | 8/1991 | Japan . | |

*Primary Examiner*—Christopher P. Ellis
*Assistant Examiner*—Joe Dillon, Jr.
*Attorney, Agent, or Firm*—Parkhurst & Wendel, L.L.P

[57] ABSTRACT

In a flip-chip mounting equipment, there is provided an IC removal device by which ICs (4) which have been recognized to be removed in error in spite of their faultlessness can be removed in a manner such that they are lined up in a row without being scratched on the surface and without incurring electrostatic destruction. Also the device allows an easy visual checking of the ICs with the objective of reuse. The device comprises a glass plate (2) for carrying ICs (4) and a mechanism for rotating this glass plate (2) at fixed angles, whereby if a recognition error occurs, a bonding head (1) with an IC (4) sucked thereby is moved to an IC removal position on the glass plate (2) and is then lowered until the IC (4) contacts the glass plate (2), thereby removing the IC (4). As a result, the ICs (4) can be lined up in a row without being scratched on the surface and without incurring electrostatic destruction, allowing an easy visual checking of the ICs with the objective of reuse.

6 Claims, 4 Drawing Sheets

1
3
4
5
2
10
4
7
8
6

IC DISCARDING APPARATUS FOR FLIP CHIP MOUNTING FACILITY

TECHNICAL FIELD

In an flip-chip installation equipment, the present invention relates to an IC removal device whereby ICs in respect of which an IC recognition error was found but which have no functional problems can be handled in such a way that they can be reused.

BACKGROUND ART

In recent years, flip-chip mounting has become the most common type of semiconductor mounting since it enables miniaturization of circuit boards as exemplified by MCM (Multichip Module) or CSP (Chip Size Package). Typically in flip-chip mounting, a recognition camera is employed to recognize an IC which is suck-held to a substrate or bonding head in order to perform correction of the mounting position immediately before mounting. When this is done, if the IC is dirty or its recognition attitude is tilted, an IC recognition error will occur; however, in order not to lower the working rate by stopping working of the equipment, the IC sucked by the bonding head is shifted by the bonding head to a removal position, whence it is then removed into a removal unit.

An example of a prior art IC removal device as referred to above is described below with reference to the drawings. FIG. 4 shows the layout of a prior art flip-chip mounting equipment fitted with an IC removal device. In FIG. 4, 1 indicates a bonding head, 3 indicates a recognition camera, 4 an IC and 5 a circuit board; 11 is an IC removal BOX fixed at a prescribed location. After the recognition camera 3 has recognized an IC 4, if a recognition error ensues, the bonding head 1, while sucking the IC 4, moves over to above the IC removal BOX 11 where the adhesion action is discontinued, allowing the IC 4 to drop into the IC removal BOX 11. After removing the IC 4, the bonding head 1 moves to the IC feed system, where it extracts a new IC 4 and performs a recognition operation.

However, since, in an IC removal device as illustrated above, an IC 4 is removed by its own free dropping into a removal BOX 11, the removed IC 4 gets scratched and damaged, and the IC 4 may also be electrostatically destroyed when it contacts the removal BOX 11. Thus, it is seldom that such ICs 4 can not be reused. A further problem is that it is difficult to handle the ICs 4 when they are to be re-examined, since they are removed into a removal BOX 11 without any particular care being exercised.

SUMMARY OF THE INVENTION

An object of the present invention is to solve the above problems and to provide an IC removal device for a flip-chip mounting equipment, whereby ICs can be reused.

This IC removal device comprises: a plate for carrying ICs; drive means for driving this plate to rotate or move at prescribed angular intervals or for prescribed distances; and a bonding head which, after lowering an IC until it contacts the plate, stops its action of sucking the IC whereby the ICs are removed to be lined up in a row on the plate; said IC removal device enabling the ICs to be reused.

The invention according to claim 1 comprises: a plate for carrying ICs; drive means for driving this plate to rotate at prescribed angular intervals; and a bonding head which, after lowering an IC until it contacts the plate, stops the action of sucking the IC whereby the ICs are removed to be lined up in a row on the plate.

Since the ICs are carried on a plate, they can be prevented from being scratched or damaged by their free dropping and, by setting the load under which the contact between the IC and plate is detected within a range such that a projecting electrode of the IC is not deformed, deformation of the projecting electrode of the IC does not occur, enabling removed ICs to be reused after rechecking. By rotating the plate at a fixed angle after completion of a removal action, the bonding head is enabled to perform the next IC removal action.

Also, the invention according to claim 2 comprises: a plate for carrying ICs; drive means for driving this plate to move at prescribed distance intervals; and a bonding head for lowering an IC into contact with the plate and then stopping the action of sucking the IC, so that ICs are removed on to the plate in a row.

Thereby, the same operational effect as that of claim 1 can be obtained.

Also, in the invention of claim 3, the plate has electrical conductivity and is constituted of a transparent material and is freely removable from or attachable to the drive means.

By detaching each plate from the drive means after completion of the removal operation, the IC can be rechecked visually from the other side of the glass, improving the operating efficiency of IC rechecking and fault analysis.

BEST MODE FOR CARRYING OUT THE INVENTION

An IC removal device in a flip-chip mounting equipment according to an embodiment of the present invention using the SBB (Stud Bump Bonding) system is described below with reference to the drawings.

Figure 1:
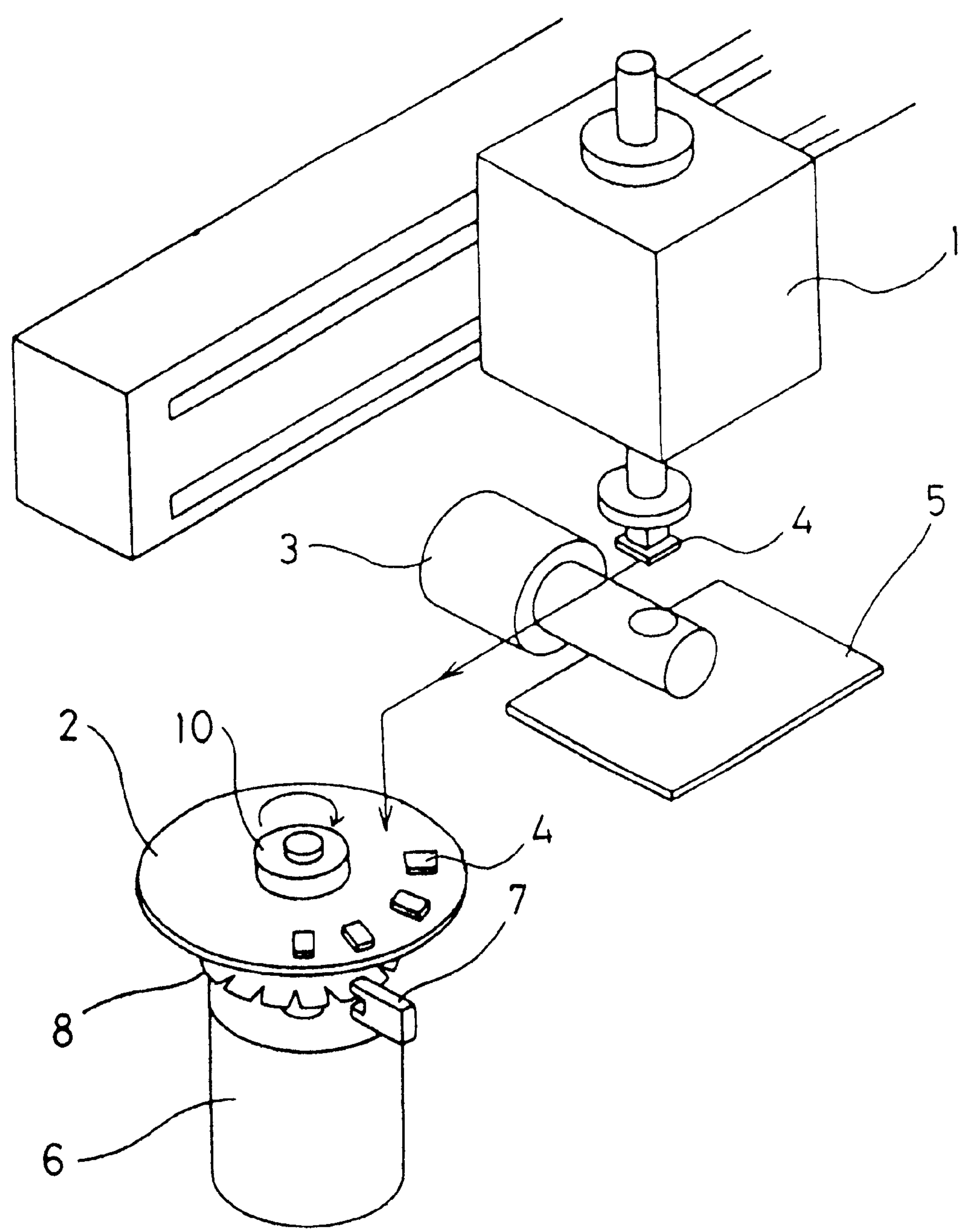
FIG. 1 is a perspective view showing diagrammatically a flip-chip mounting equipment provided with an IC removal device according to an embodiment of the present invention.

FIG. 1 shows the construction of a flip-chip mounting equipment fitted with an IC removal device according to the present invention. In FIG. 1, 1 indicates a bonding head, 2 indicates a disc-shaped glass plate having a film of ITO (Indium Oxide-Tin Oxide) evaporated on to its IC-contacting side, 3 indicates a recognition camera, 4 indicates a stud bump IC, 5 a circuit board, 6 an induction motor, 7 a photosensor for calculating angles, 8 a dog provided with slits at prescribed angular intervals, and 10 a knob for fixing the glass plate. Also, the glass plate 2 is constituted with an ITO film having conductivity and its IC-contacting face is electrically ground so as to prevent electrostatic destruction of the stud bump IC 4.

Prior to the operation of a removal action, the stud bump IC 4 is sucked by the bonding head 1 and the recognition camera 3 performs a recognition operation on the stud bump IC 4 and circuit board 5 for correction of the mounting position. At this point, if the pattern surface of the stud bump IC 4 is stained with some dirt or its recognition attitude is severely tilted, a recognition error results. In order not to stop the operation of the equipment, the bonding head 1 automatically moves to the removal position while sucking a stud bump IC 4, and performs the removal action on the stud bump IC 4.

This removal action is performed by lowering the stud bump IC 4 by the bonding head 1 until the stud bump IC 4 contacts the glass plate 2, and when the contact is detected, the sucking action is stopped and the stud bump IC 4 is laid on the glass plate 2. In this action, the load at the time of the contact is within a range such as not to cause deformation of the bump shape of a stud bump IC 4. After this, the bonding head 1 is raised and the glass plate 2 is then rotated by a fixed angular amount by means of the induction motor 6 in accordance with the angle-calculating photosensor 7 and dog 8, thereby enabling the next stud bump IC 4 removal action to be performed. By repeating this action, stud bump ICs 4 are arranged in a row when they are removed on to the glass plate 2.

According to this construction, since stud bump ICs 4 are placed on the glass plate 2, stud bump ICs 4 can be prevented from being scratched or damaged, unlike the conventional cases where stud bump ICs 4 are caused to freely drop. Also, since the load under which the contact between the stud bump IC 4 and glass plate 2 is detected is set in a range such that a projecting electrode of the stud bump IC 4 does not deform, and the removed stud bump ICs 4 can be reused after rechecking.

It should be noted that, by making a glass plate 2 of an elongate rectangular shape and, instead of photosensor 7, dog 8 and induction motor 6, employing drive means for driving this glass plate 2 at a fixed pitch in the X-Y direction, stud bump ICs 4 to be removed are laid on the glass plate 2 which is then moved for a prescribed distance in the X-Y direction so that the next stud bump IC 4 removal action may be performed, enabling the same operating benefits to be obtained. Also, the same benefits as described above can be obtained by providing drive means for rotation and/or drive means for movement by use of a servo motor, instead of providing a sensor to detect the angle of movement or distance of movement.

Figure 2:
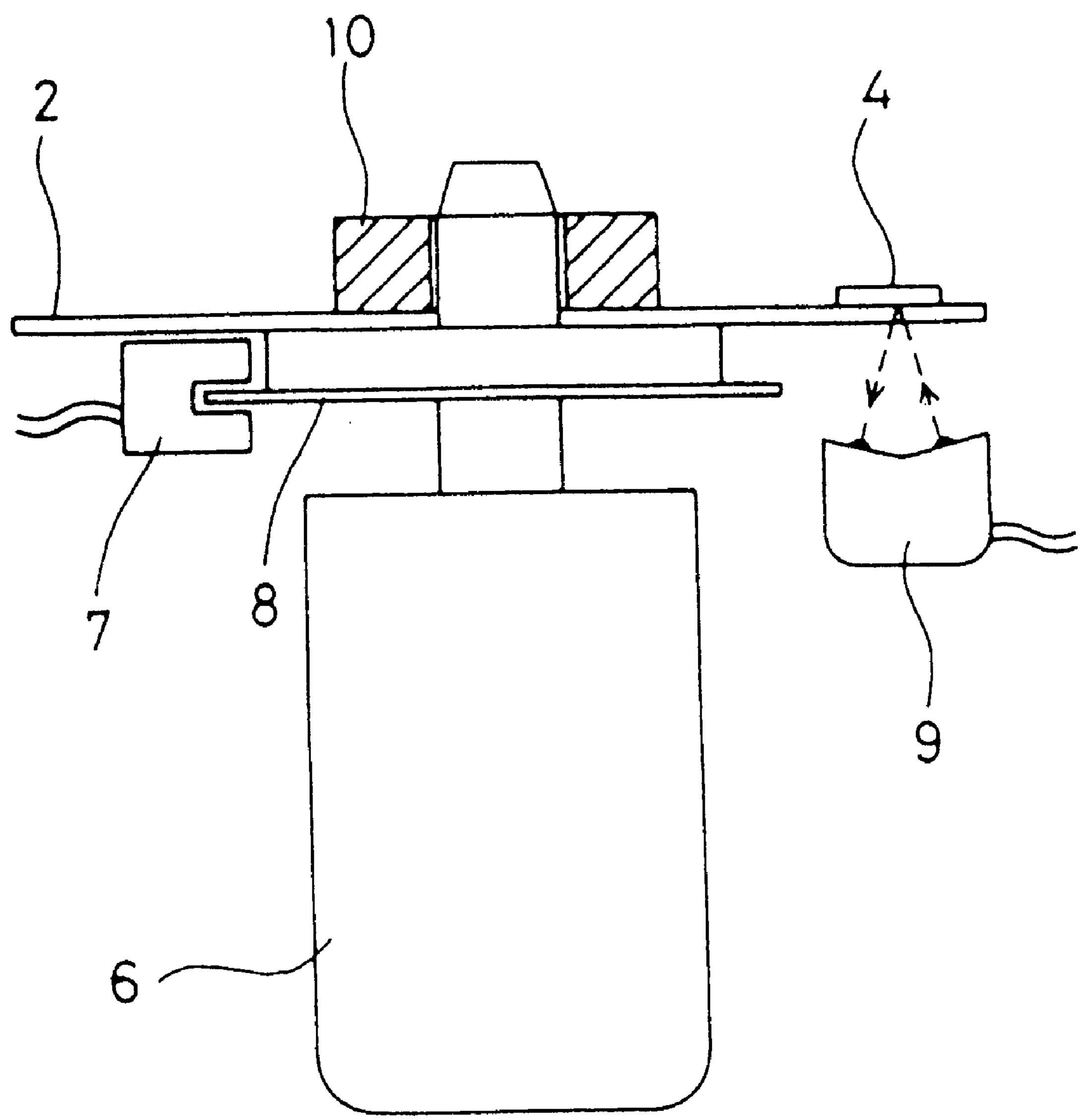
FIG. 2 is a diagrammatic front view showing how an IC is detected in this IC removal device for the flip-chip mounting equipment.

As shown in FIG. 2, the above action may be performed whilst detecting the presence of a stud bump IC 4 on a glass plate 2. As shown in FIG. 2, an IC detection photoelectric sensor 9 is arranged at a location corresponding to an IC removal position below the glass plate 2. This enables the presence of a stud bump IC 4 at an IC removal position on a glass plate 2 to be detected through the glass plate 2, thereby preventing overlapping of stud bump ICs 4.

Thus, by arranging the IC detection photoelectric sensor 9 below the glass plate 2, the detection distance of the IC detection photoelectric sensor 9 can be shortened and spurious detection eliminated, and the stud bump ICs 4 can be placed on to the glass plate 2 without hindrance.

Figure 3:
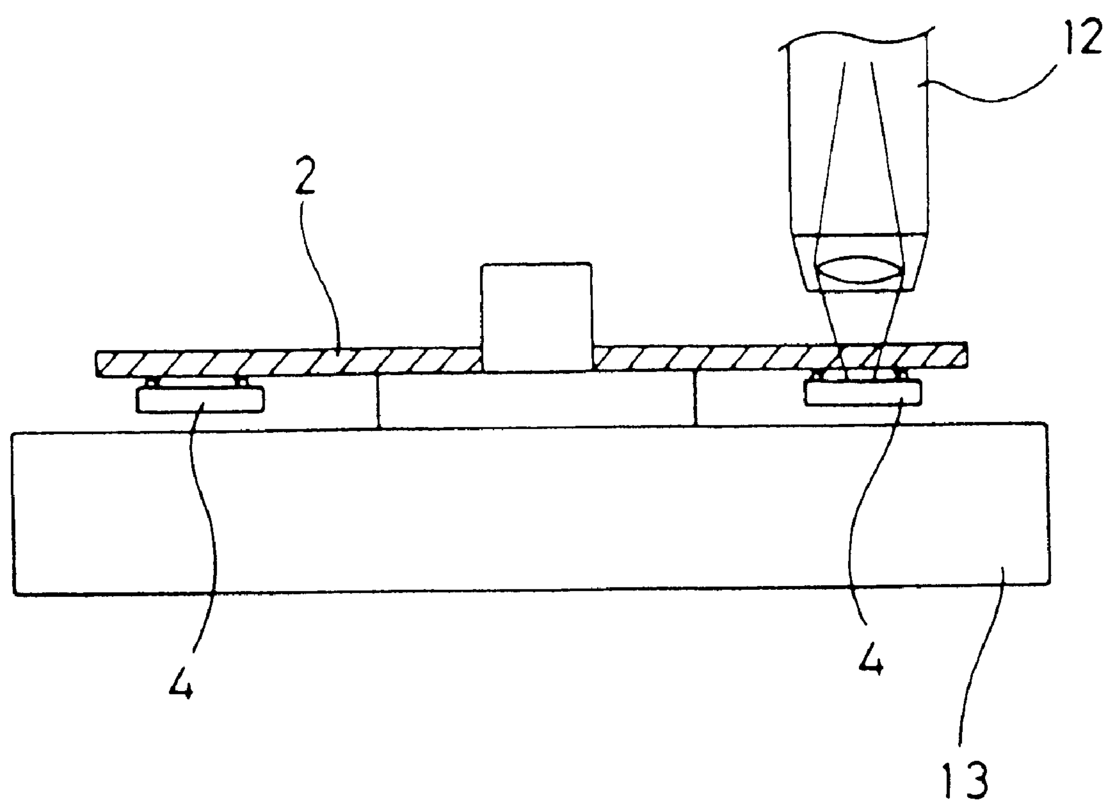
FIG. 3 is a diagrammatic front view showing how an IC is checked in this flip-chip mounting equipment IC removal device.
Figure 4:
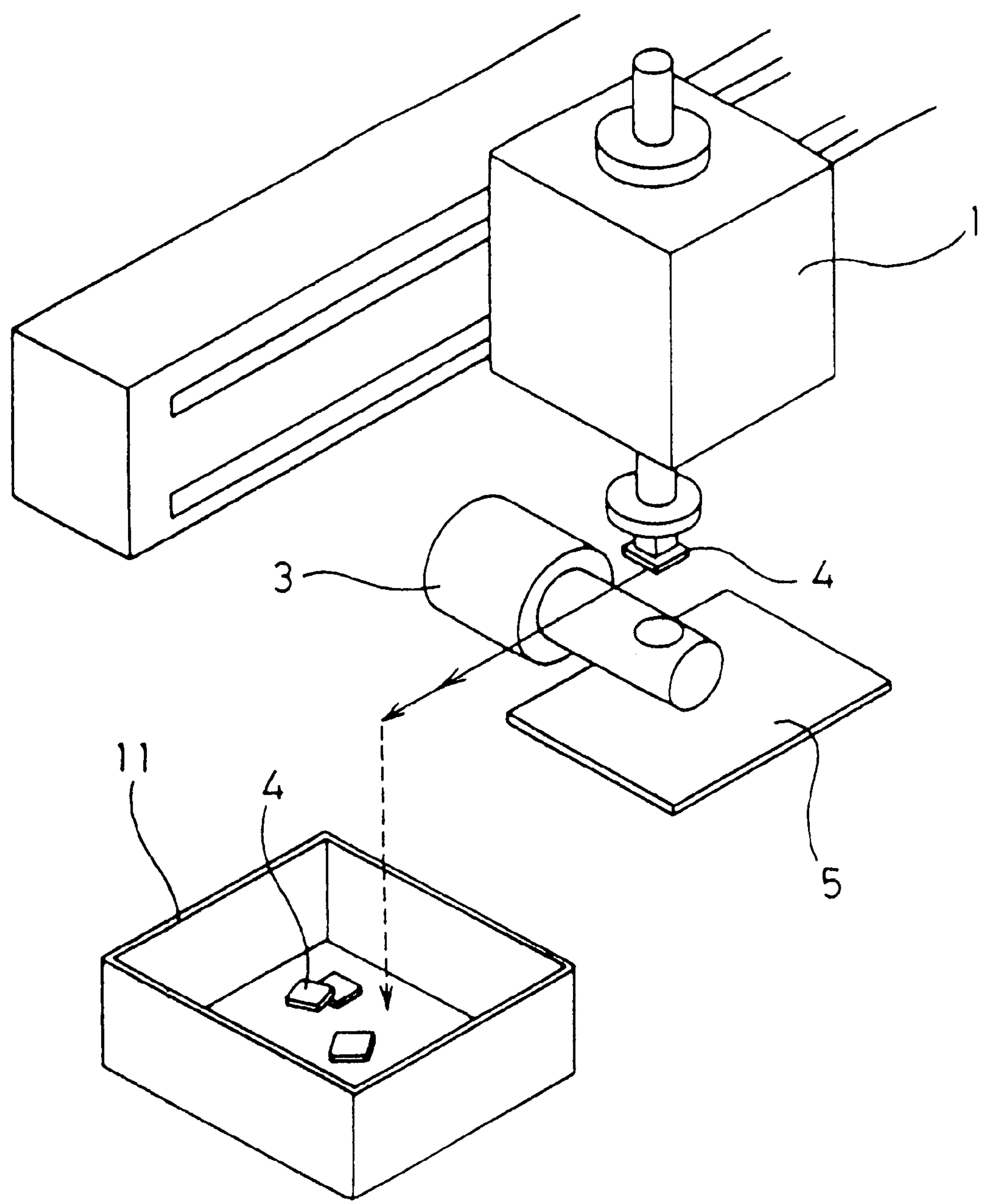
FIG. 4 is a diagrammatic perspective view showing a flipchip mounting equipment provided with a prior art IC removal device.

Also, by removing a knob 10, the glass plate 2 can be made removable from and attachable to the main body of a removal device, that is, the drive means such as an induction motor 6. FIG. 3 shows diagrammatically a method for rechecking ICs using a glass plate 2. Since a stud bump IC 4 already has conductive paste applied to it, a removed stud bump IC 4 is fixed on to the glass plate 2 by the tacky adhesive force of the conductive paste. In this way, a glass plate 2, in the condition with a stud bump IC fixed on to it, can be separated from the main body of the removal device, and the glass plates 2 can then be successively transported to and fixed in a fixed jig 13, where rechecking and fault analysis of the stud bump ICs 4 can be performed by visually examining the IC pattern surface through the glass plate 2 with the aid of an optical microscope 12. That is, by making a plate 2 using a transparent material such as glass and arranging it to be removable from or attachable to the drive means, rechecking and fault analysis of the ICs can be performed in an operationally convenient manner. The same benefits as described above could also be obtained by making a glass plate 2 using a transparent resin having electrical conductivity. As a matter of course, the invention could also be applied to the ICs other than the stud bump ICs 4.

What is claimed is:

1. An IC removal device for flip-chip mounting equipment comprising:

a plate for carrying ICs;

drive means for rotating said plate through prescribed angular increments; and a bonding head for lowering an IC to a position on said plate and thereafter ceasing a vacuum suction applied to the IC by the bonding head, so that ICs are positioned without being damaged on said plate in a row wherein said plate is freely removable from or attachable to said drive means for examining an IC.

2. An IC removal device for flip-chip mounting equipment comprising:

a plate for carrying ICs;

drive means for driving said plate to move at prescribed distance intervals; and a bonding head for lowering an IC to a position on said plate and thereafter ceasing a vacuum suction applied to the IC by the bonding head, so that ICs are positioned without being damaged on said plate in a row wherein said plate is freely removable from or attachable to said drive means for examining an IC.

3. The IC removal device for flip-chip mounting equipment according to claim 1 or claim 2, wherein said plate has electrical conductivity and is comprised of a transparent material which permits detection of the presence of chips on said plate.

4. The IC removal device for flip-chip mounting equipment according to claim 1 or claim 2 wherein said IC chip is a stud bump chip.

5. A method of removing a defectless IC from flip-chip mounting operation after said IC has been incorrectly diagnosed as defective, said method comprising:

applying a suction to an IC via a bonding head;

recognizing a position of said IC with a recognition camera;

determining if said IC is acceptable, and if said IC is unacceptable said bonding head is moved to a removal location for depositing said IC onto a plate;

rotating said plate by a fixed angular amount thereby providing an IC free surface wherein an unacceptable IC is placed;

lowering said IC until contact is established between said IC and said plate; and ceasing said suction to deposit said IC on said plate.

6. A method of mounting a flip-chip according to claim 5 wherein a location or presence of a chip on said plate is detected by a transmission of light.

* * * * *